United States Patent
Gustafson et al.

(10) Patent No.: US 12,040,909 B2
(45) Date of Patent: *Jul. 16, 2024

(54) WIRELESS BROADBAND METER COLLAR

(71) Applicant: Avista Edge, Inc., Spokane, WA (US)

(72) Inventors: Mark Wayne Gustafson, Spokane, WA (US); Curtis Allen Kirkeby, Spokane, WA (US); Stephen Edward Schulte, Spokane, WA (US)

(73) Assignee: Avista Edge, Inc., Spokane, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/206,712

(22) Filed: Jun. 7, 2023

(65) Prior Publication Data

US 2023/0318867 A1     Oct. 5, 2023

Related U.S. Application Data

(63) Continuation of application No. 17/319,310, filed on May 13, 2021, now Pat. No. 11,711,232, which is a
(Continued)

(51) Int. Cl.
*H04L 12/10* (2006.01)
*G01R 21/00* (2006.01)
(Continued)

(52) U.S. Cl.
CPC ........ *H04L 12/2801* (2013.01); *G01R 21/007* (2013.01); *H04L 12/10* (2013.01);
(Continued)

(58) Field of Classification Search
CPC .................................................. H04L 12/2801
(Continued)

(56) References Cited

U.S. PATENT DOCUMENTS 6,628,627 B1 * 9/2003 Zendle ................. H04W 84/14
                                                    370/310
7,561,867 B2   7/2009 Frye, Jr.
(Continued)

FOREIGN PATENT DOCUMENTS

WO    WO2021/188622 A1    9/2021

OTHER PUBLICATIONS

Dai, et al., "Multiband and Dual-Polarized Omnidirectional Antenna for 2G/3G/LTE Application", IEEE Antennas and Wireless Propagation Letters, vol. 12, 2013, 4 pgs.
(Continued)

*Primary Examiner* — Qutbuddin Ghulamali
(74) *Attorney, Agent, or Firm* — Lee & Hayes, P.C.

(57) ABSTRACT

A broadband access system, comprising a broadband access hub device (hub device) and broadband access premise devices (premise devices) wirelessly coupled the hub device to provide broadband services to multiple user equipment (UEs), is described. The hub device may access broadband services on a fiber optic broadband network and wirelessly provide access to the broadband services to the premise devices. The premise device may wirelessly communicate with the hub device and communicate with user equipment (UEs) for providing access to the broadband services through the hub device. The premise device may be attached to an electric utility meter, and a power interface module of the premise device may supply electrical power to the premise device from the electric utility meter.

20 Claims, 3 Drawing Sheets

Related U.S. Application Data continuation of application No. 16/866,006, filed on May 4, 2020, now Pat. No. 11,032,096, which is a continuation of application No. 16/160,807, filed on Oct. 15, 2018, now Pat. No. 10,686,619.

(51) Int. Cl.
  *H04L 12/28* (2006.01)
  *H04W 16/28* (2009.01)
  *H04W 84/12* (2009.01)

(52) U.S. Cl.
  CPC ...... *H04L 12/2885* (2013.01); *H04L 12/2898* (2013.01); *H04W 16/28* (2013.01); *H04W 84/12* (2013.01)

(58) Field of Classification Search
  USPC .......................................................... 370/254
  See application file for complete search history.

(56) References Cited

U.S. PATENT DOCUMENTS

| | | | |
|---|---|---|---|
| 8,022,690 | B2 | 9/2011 | Kagan |
| 8,947,258 | B2 | 2/2015 | Pant et al. |
| 8,983,451 | B2 | 3/2015 | Yoon et al. |
| 10,886,748 | B1 | 1/2021 | Karlgaard et al. |
| 2006/0193151 | A1 | 8/2006 | Quan et al. |
| 2006/0222086 | A1 | 10/2006 | Frye, Jr. |
| 2007/0201540 | A1 | 8/2007 | Berkman |
| 2008/0063397 | A1 | 3/2008 | Hu et al. |
| 2008/0129536 | A1 | 6/2008 | Randall et al. |
| 2009/0248794 | A1* | 10/2009 | Helms ................... H04L 65/612 709/203 |
| 2010/0253538 | A1* | 10/2010 | Smith ..................... G01D 4/002 29/601 |
| 2010/0328097 | A1 | 12/2010 | Leo et al. |
| 2011/0140911 | A1* | 6/2011 | Pant ......................... H04B 3/58 340/12.34 |
| 2011/0264295 | A1 | 10/2011 | Schmelcher |
| 2012/0050971 | A1 | 3/2012 | Seal et al. |
| 2012/0225624 | A1 | 9/2012 | Kyösti et al. |
| 2013/0171946 | A1 | 7/2013 | Veihl et al. |
| 2014/0066098 | A1* | 3/2014 | Stern ................... H04L 12/2801 455/456.3 |
| 2014/0218010 | A1 | 8/2014 | Fulton et al. |
| 2014/0233951 | A1 | 8/2014 | Cook |
| 2015/0011273 | A1 | 1/2015 | Wilmhoff et al. |
| 2015/0180121 | A1 | 6/2015 | Johansson et al. |
| 2015/0195001 | A1 | 7/2015 | Barker et al. |
| 2015/0263409 | A1 | 9/2015 | Tseng et al. |
| 2015/0311951 | A1* | 10/2015 | Hariz ................... H04W 88/16 375/257 |
| 2015/0325984 | A1 | 11/2015 | Knauer et al. |
| 2017/0018837 | A1 | 1/2017 | Bietz |
| 2017/0062952 | A1 | 3/2017 | Sundararajan et al. |
| 2017/0215295 | A1* | 7/2017 | Herzig .............. H01L 31/02021 |
| 2018/0188072 | A1 | 7/2018 | Barnett, Jr. et al. |
| 2018/0376228 | A1 | 12/2018 | Erreygers et al. |
| 2019/0101411 | A1 | 4/2019 | Davis et al. |
| 2019/0159353 | A1 | 5/2019 | Herzig et al. |
| 2019/0319336 | A1 | 10/2019 | Bell |
| 2019/0326662 | A1 | 10/2019 | Zimmerman et al. |
| 2020/0119937 | A1 | 4/2020 | Gustafson et al. |
| 2020/0153493 | A1 | 5/2020 | Zhong et al. |
| 2020/0267012 | A1 | 8/2020 | Gustafson et al. |
| 2021/0037606 | A1 | 2/2021 | Schafer et al. |
| 2021/0227396 | A1 | 7/2021 | Khalid et al. |
| 2021/0297111 | A1 | 9/2021 | Schafer et al. |
| 2021/0297141 | A1 | 9/2021 | Schafer et al. |
| 2022/0029847 | A1 | 1/2022 | Gustafson et al. |
| 2022/0173504 | A1 | 6/2022 | Meyer et al. |
| 2022/0407561 | A1 | 12/2022 | Schafer |

OTHER PUBLICATIONS

Hanson, "Meter Collars for Distributed Generation", Business and Technology Strategies, Jan. 2016, 10 pgs.
Invitation to pay fees dtd May 27, 2021 for App PCT/US21/22683, "Modular Customer Premises Equipment for Providing Broadband Internet", 2 pages.
Le, et al., "Advanced Metering Infrastructure Based on Smart Meters in Smart Grid", Intech, 2016, 26 pgs.
Non Final Office Action dated Feb. 5, 2020 for U.S. Appl. No. 16/160,807 "Wireless Broadband Meter Collar" Gustafson, 8 pages.
Non Final Office Action dated Aug. 20, 2020 for U.S. Appl. No. 16/526,358, "Wireless Broadband Meter Collar", Schafer, 13 pages.
Non Final Office Action dated Sep. 4, 2020 for U.S. Appl. No. 16/866,006, "Wireless Broadband Meter Collar", Gustafson, 8 pages.
Office Action for U.S. Appl. No. o:\docs\a235\0033usc2\2tz4685.pdf, mailed on Jan. 20, 2023, Gustafson, "Wireless Broadband Meter Collar", 8 Pages.
Office Action for U.S. Appl. No. 17/202,526, mailed on Mar. 17, 2022, Schafer, "Modular Customer Premises Equipment for Providing Broadband Internet", 19 Pages.
Office Action for U.S. Appl. No. 17/893,490, mailed on Apr. 27, 2023, Schafer, "Modular Customer Premises Equipment for Providing Broadband Internet", 28 pages.
The PCT Search Report and Written Opinion mailed Sep. 9, 2020, for PCT Application No. PCT/US20/44355, 9 pages.
PCT Search Report & Written Opinion dtd Aug. 2, 2021, 10 pages.
Sandhu, et al., "A 28-GHz 32 Element TRX Phased-Array IC With Concurrent Dual-Polarized Operation and Orthogonal Phase and Gain Control for 5G Communications", IEEE Journal of Solid-State Circuits, vol. 52, No. 12, Dec. 2017, 19 pgs.
"The Simple ConnectDER(TM)," 2 pages, May 12, 2015.
Zhao, et al., "A Wideband Dual-Polarized Omnidirectional Antenna for 5G/WLAN", IEEE Access, Feb. 8, 2019, 7 pgs.
The Extended European Search Report mailed Jul. 18, 2023 for European Patent Application No. 20846710.0, 11 pgs.
Office Action for U.S. Appl. No. 17/893,490, mailed on Aug. 16, 2023, Schafer, "Modular Customer Premises Equipment for Providing Broadband Internet", 15 pages.

* cited by examiner

WIRELESS BROADBAND METER COLLAR

CROSS-REFERENCE TO RELATED PATENT APPLICATION

This application is a continuation of and claims priority to U.S. patent application Ser. No. 17/319,310, filed May 13, 2021, which is a continuation of U.S. patent application Ser. No. 16/866,006, filed May 4, 2020, now U.S. Pat. No. 11,032,096, issued Jun. 8, 2021, which is a continuation of U.S. patent application Ser. No. 16/160,807, filed Oct. 15, 2018, now U.S. Pat. No. 10,686,619, issued Jun. 16, 2020, all of which are entitled "Wireless Broadband Meter Collar," which disclosures are hereby incorporated by reference in their entirety.

BACKGROUND

The demand for services available on the Internet and the availability of devices to access the Internet for the services have been increasing rapidly. An access point, such as a home wireless local area network (WLAN) router connected to an Internet service provider, often becomes a bottleneck for accommodating communication and data exchange demands between the home WLAN router and devices connected to the home WLAN router. For example, a family of four may share the same home WLAN with a first person streaming a high definition movie to his smart phone, a second person video chatting with a friend on his laptop computer, a third person downloading HD movies to his pad device, and a fourth person playing an online video game on his computer. Each of the activities requires a high rate of data via the home WLAN, and when the home WLAN fails to meet the demands from these devices, it often leads to unfavorable user experience. For example, the download speed may become slower than expected or desired, video quality may degrade, buffering of data may become more frequent and longer, and the service may even be terminated due to the lack of adequate and continuous communication or data exchange between the device and the service being used on the Internet. Sometimes the cause of the bottleneck is due to the capacity of the home WLAN router itself, but, more often, it is due to the limited speed available from the Internet service provider.

Internet service providers, such as cable TV and telecommunication companies, have begun providing broadband services that is capable of down-load speed of one gigabit-per-second (Gbps) and higher, however, such services generally require access to a fiber optic broadband network and are limited to certain geographical areas. At least partially due to associated costs of physically extending the fiber optic broadband network to individual homes, the fiber optic broadband network for the final portion of the Internet and/or telecommunication network, also known as the last mile, mostly remains incomplete, and a high-speed broadband service, such as 1 Gbps service, remains unavailable for customers without access to a fiber optic broadband network.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Systems and devices discussed herein are directed to providing broadband services, and more specifically to providing broadband services to user equipment (UEs) in a vicinity of an electrical utility meter.

A broadband access system, comprising a broadband access hub device (hub device) and one or more broadband access premise devices (premise devices) wirelessly coupled the hub device to provide broadband services to multiple user equipment (UEs), is described. By wirelessly coupling the hub device and one or more premise devices, cost, time, and inconveniences, sometimes referred as the last mile problem, associated with providing broadband services to premises, such as homes and businesses, may be reduced compared to physically connecting each premise to a fiber optic broadband network for broadband services.

The hub device may be coupled to a fiber optic broadband network via a fiber optic interface module to access broadband services available on the fiber optic broadband network and provide access to the broadband services to the premise devices by wirelessly communicating with the premise devices using a first telecommunication protocol via a hub antenna. The premise device may have a first antenna, a second antenna, and a power interface module, and may be configured to wirelessly communicate with the hub device via the first antenna using the first telecommunication protocol. The premise device may further be configured to communicate with user equipment (UEs) via the second antenna using a second telecommunication protocol for providing access to the broadband services through the hub device. The power interface module may be configured to supply electrical power to the broadband access premise device from an electric utility meter.

Figure 1:
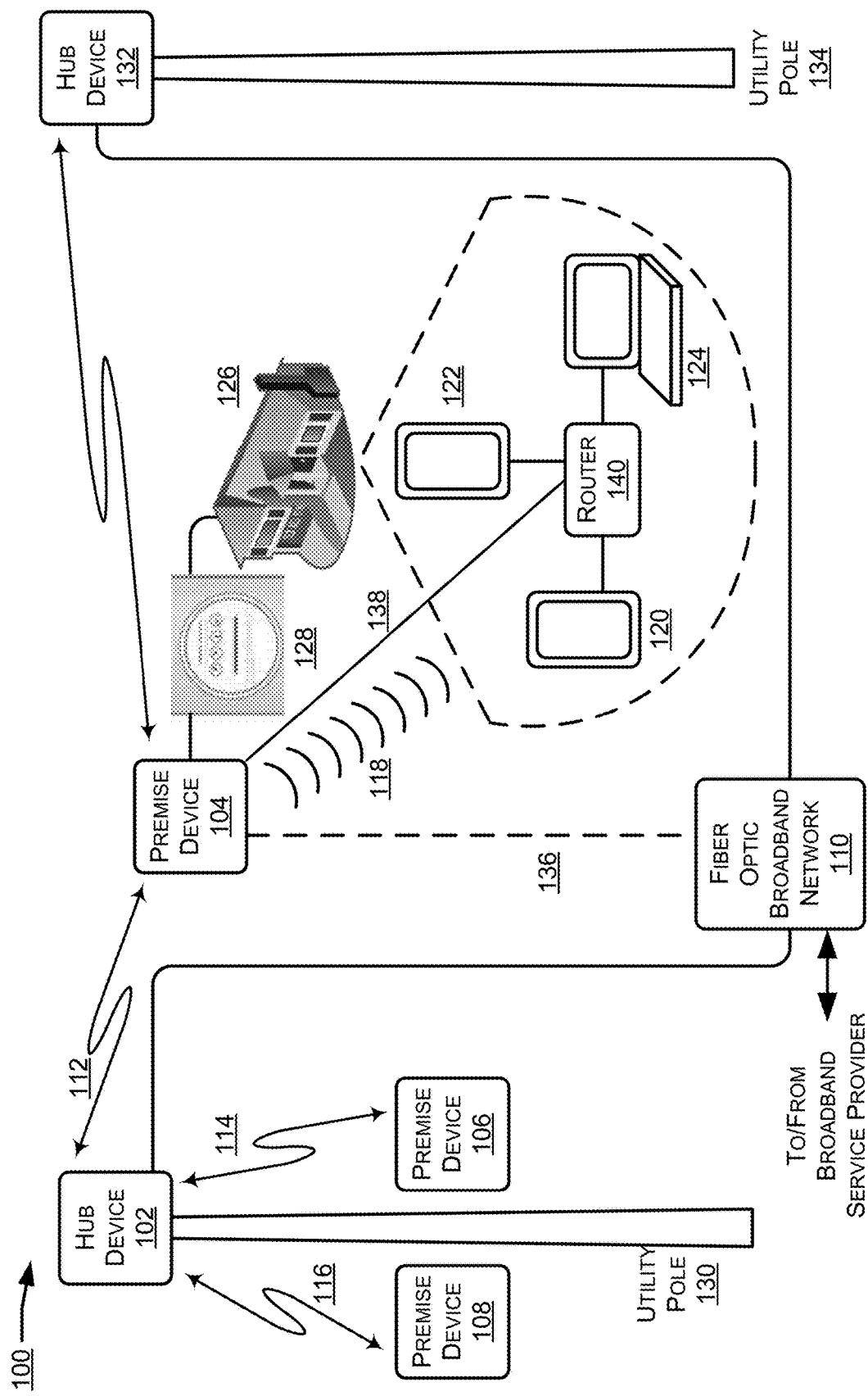
FIG. 1 illustrates an example block diagram of a broadband access system.

FIG. 1 illustrates an example block diagram of a broadband access system 100.

The broadband access system 100 may comprise a broadband access hub device (hub device) 102 and broadband access premise devices (premise devices), of which three premise devices 104, 106, and 108 are shown in this example. The broadband access hub device 102 may be connected to a fiber optic broadband network 110 and access broadband services available on the fiber optic broadband network 110 provided by a broadband service provider (not shown). The hub device 102 may wirelessly communicate with the premise devices 104, 106, and 108, as shown by arrows 112, 114, and 116, respectively, to provide access to the broadband services on the fiber optic broadband network 110 using a first telecommunication protocol via a hub antenna (not shown) of the hub device 102.

The premise device 104, as an example of the premise devices, may have a first antenna (not shown), a second antenna (not shown), and a power interface module (not shown). The premise device 104 may be configured to wirelessly communicate, as shown with arrow 112, with the hub device 102 via the first antenna using the first telecommunication protocol to access the broadband services on the fiber optic broadband network 110. Alternatively, or additionally, the premise device 104 may be connected directly to the fiber optic broadband network 110 as shown by a dotted line 136. The premise device 104 may be configured to communicate with a plurality of user equipment (UEs), as shown by 118, via the second antenna using a second telecommunication protocol for providing access to the broadband services through the hub device 102. Three UEs, 120, 122, and 124 belonging to a premise 126, such as family members of a household, business employees, etc., are shown in this example as being in communication with the premise device 104 and being able to access the broadband services such as access to the Internet. Alternatively, or additionally, the premise device 104 may communicate with the UEs 120, 122, and 124 via a wireline communication 138 and a router 140, which may be supplied by a customer. The wireline communication 138 may be Ethernet or Powerline communication. The router 140 may communicate with the UEs 120, 122, and 124 wirelessly such as Wifi, NFC, and the like, or via a wired communication such as Ethernet, USB, and the like.

The premise device 104 may be configured to attach as a meter collar to an electric utility meter 128, which may be a smart meter, of the premise 126, and the power interface module may be configured to supply electrical power to the premise device 104 from the electric utility meter 128. The premise device 104 may be further configured to read electrical information, such as electrical consumption and/or generation over a certain period, statistical data analysis of thereof, outage information, etc. stored in memory of the electric utility meter 128, that is electrical information of the premise 126 associated with the electric utility meter 128. The premise device 104 may be configured to transmit the electrical information to a service entity (not shown) associated with the electric utility meter 128 using the broadband services via the hub device 102.

The premise device 104 may be configured to communicate with the hub device 102 using a first radio frequency (RF) spectrum and communicate with the UEs 120, 122, and 124 using a second RF spectrum, where the first RF spectrum may be in the millimeter wave spectrum. The hub antenna of the hub device 102 and the first antenna of the premise device 104 may be configured to beam-form for achieving optimum link properties with each other. The second antenna of the premise device 104 may also be configured to beam-form for achieving optimum link properties with the UEs, such as UEs 120, 122, and 124, in communication with the premise device 104. The beamforming may be achieved by using an antenna array or a multiple-input multiple-output (MIMO) antenna. To avoid RF interferences, the premise device 104 may be configured to use channels in the second RF spectrum to communicate with the UEs 120, 122, and 124, that are different from channels in the second RF spectrum used by a neighboring premise device, such as the premise devices 106 and 108.

The hub device 102 may be configured to be mounted on a structure such as a side of a building, a powerline tower, a pad mount on the ground, a utility structure such as a telephone or a utility pole such as a utility pole 130 shown in this example, or on any suitable mount, to communicate with nearby premise devices such as the premise devices 104, 106, and 108. Each premise device may also be covered by another, or a secondary hub device, such as a hub device 132 shown in this example as mounted on another utility pole 134 and in communication with the premise device 104. The hub device 132 may also be connected to the same fiber optic broadband network 110 as the premise device 102, to provide access to the broadband services to the premise device 104.

Figure 2:
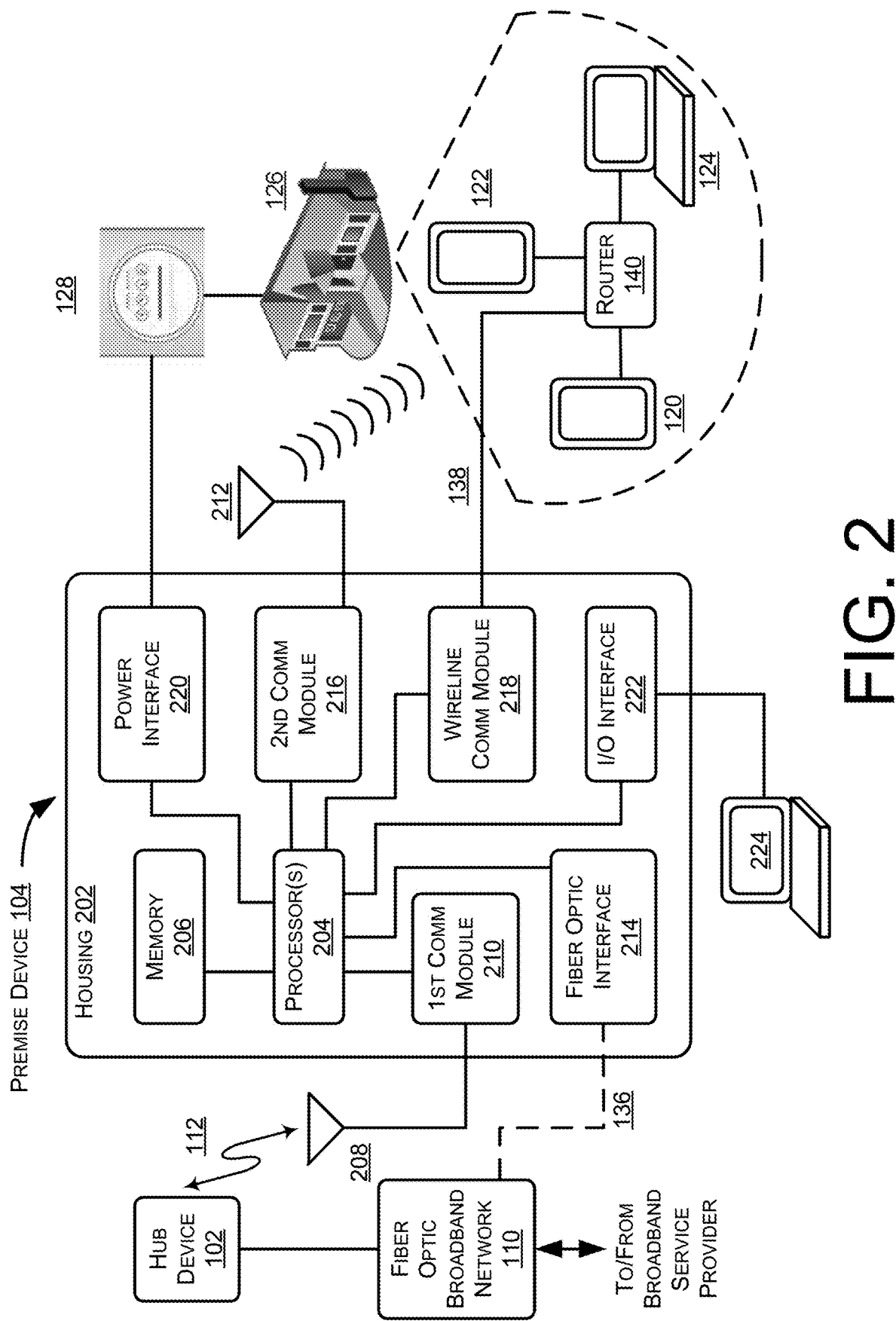
FIG. 2 illustrates an example block diagram of the broadband access premise device of FIG. 1 shown with associated external components.

FIG. 2 illustrates an example block diagram of the broadband access premise device 104 of FIG. 1 shown with associated external components.

The premise device 104 may comprise a housing 202, which may house one or more processors 204, memory 206, a first antenna 208, a first communication module 210, a second antenna 212, and a second communication module 214.

In some embodiments, the processors 204 may include a central processing unit (CPU), a graphics processing unit (GPU), both CPU and GPU, or other processing units or components known in the art. Additionally, each of the processors 204 may possess its own local memory, which also may store program modules, program data, and/or one or more operating systems.

Depending on the exact configuration and type of the premise device 104, the memory 206 may be volatile, such as RAM, non-volatile, such as ROM, flash memory, miniature hard drive, memory card, and the like, or some combination thereof. The memory 206 may include an operating system, one or more program modules, and may include program data.

The processors 204 may be coupled to the memory 206 and execute computer executable instructions stored in the memory 206. The processors 204 may be also coupled modules and components of the premise device 104 and may perform various functions including instructing and causing the modules and components of the premise device 104 to perform their associated functions. The first antenna 208 and the second antenna 212 may be located inside, outside, or on the outside surface, of the housing 202. In this example, as shown in FIG. 2, the first antenna 208 and the second antenna 212 are shown to be located outside of the housing 202.

The first communication module 210 may be coupled to the first antenna 208 and communicate with the hub device 102 using a first telecommunication protocol via the first antenna 208 for accessing broadband services on the fiber optic broadband network 110. The first communication module 210 may communicate with the hub device 102 in a first radio frequency (RF) spectrum, such as a millimeter wave spectrum, and the first antenna 208 may be configured to beam-form for achieving optimum link properties with the premise device 104 and the hub device 102. The first communication module 210 may also be configured to communicate with another hub device, such as the hub device 132 as described above with reference to FIG. 1. Alternatively, or additionally, the premise device 104 may comprise a fiber optic interface 214 connected directly to the fiber optic broadband network 110 as shown by a dotted line 136 to access the broadband service.

The second communication module 216 may be coupled to the second antenna 212 and the first communication module 210 via the processors 204. The second communication module 216 may be configured to communicate with the UEs 120, 122, and 124 in a second RF spectrum using a second telecommunication protocol via the second antenna 212 for providing access to the broadband services to the UEs 120, 122, and 124 via the first communication module 210. The second antenna 212 may be configured to beam-form for achieving optimum link properties with the UEs 120, 122, and 124. The second communication module 216 may be configured to use channels in the second RF spectrum to communicate with the UEs 120, 122, and 124 that are different from channels in the second RF spectrum used by a neighboring broadband access premise device, such as the premise device 106 as discussed above with reference to FIG. 1. Alternatively, or additionally, the premise device 104 may comprise a wireline communication module 218 to communicate with the UEs 120, 122, and 124 via a wireline communication 138 and a router 140. The wireline communication 138 may be Ethernet or Powerline communication. The router 140 may communicate with the UEs 120, 122, and 124 wirelessly such as Wifi, NFC, and the like, or via a wired communication such as Ethernet, USB, and the like.

The premise device 104 may also comprise a power interface module 220, coupled to the processors 204, housed in the housing 202. The power interface module 220 may be coupled the electric utility meter 128 and supply electrical power from the electric utility meter 128 to some or all components and modules of the premise device 104. The premise device 104, more specifically the housing 202, may be configured to attach as a meter collar to the electric utility meter 128. If the electric utility meter 128 is a smart meter, it may store electrical information associated with the electric utility meter 128, i.e., electrical information of the premise 126, in its memory for reporting to an associated service entity. The power interface module 220 may read the electrical information from the memory of the electric utility meter 128 and provide to the first communication module 210 for transmitting the electrical information to the associated service entity using the broadband services on the fiber optic broadband network 110.

The premise device 104 may additionally comprise an input/output (I/O) interface module 222 coupled to the processors 204. The I/O interface module 222 may be configured to communicate with a programming device, such as a computing device 224 loaded with appropriate applications for programming or checking the status of the premise device 104. The computing device 224 may have input device(s), such as a keyboard, a mouse, a pen, a voice input device, a touch input device, and the like, and output device(s), such as a display, speakers, a printer, and the like.

The I/O interface module 222 may comprise a connector, such as a telco connector, a USB connector, a RJ45 connector, and the like, and/or an RF communication module such as a near field communication (NFC), Bluetooth communication, or Wifi communication module for communication with the computing device 224.

Figure 3:
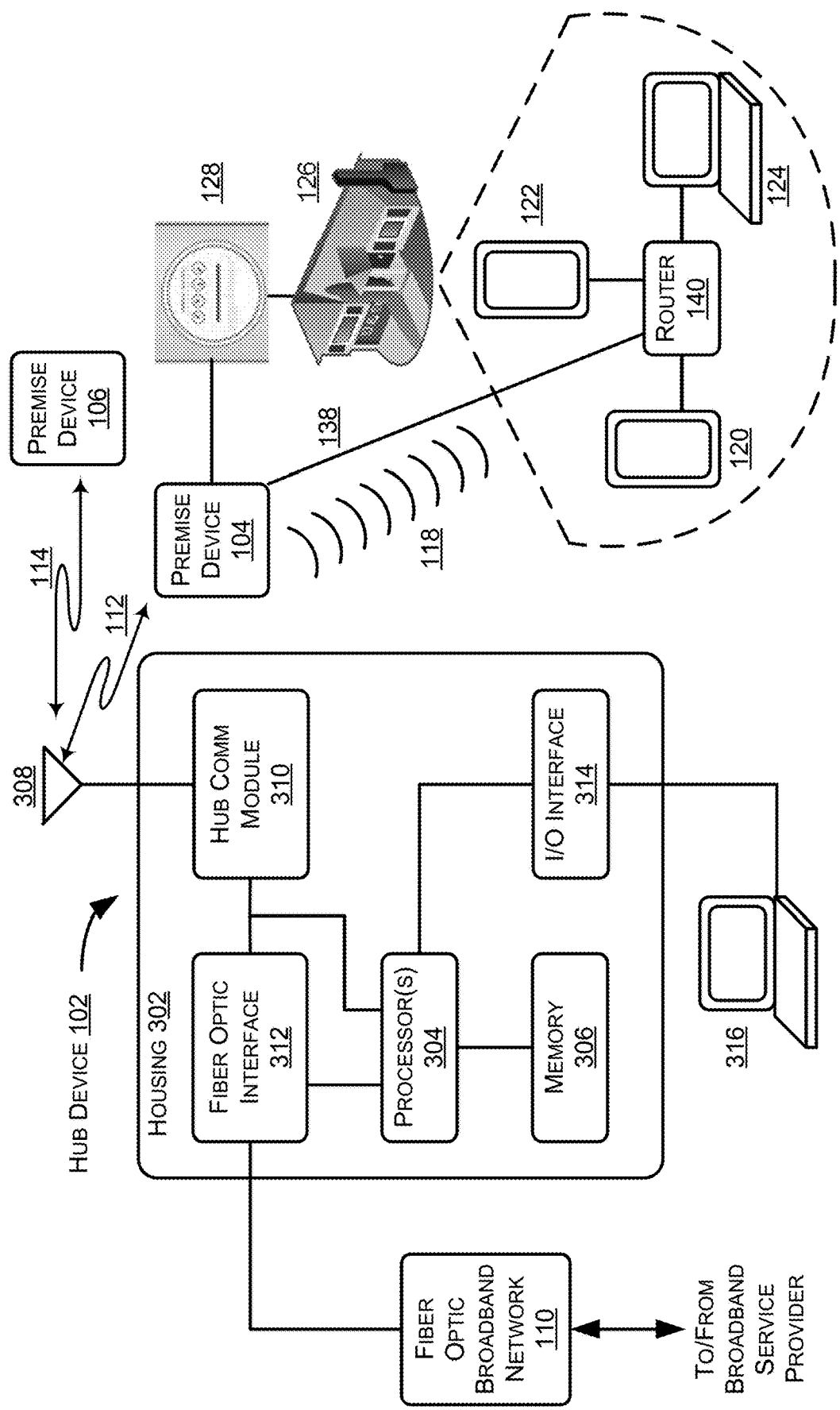
FIG. 3 illustrates an example block diagram of the broadband access hub device of FIG. 1 shown with associated external components.

FIG. 3 illustrates an example block diagram of the broadband access hub device (hub device) 102 of FIG. 1 shown with associated external components.

The hub device 102 may comprise a housing 302, which may house one or more processors 304, memory 306, a hub antenna 308, a hub communication module 310, a fiber optic interface module 312, and an I/O interface module 314.

In some embodiments, the processors 304 may include a central processing unit (CPU), a graphics processing unit (GPU), both CPU and GPU, or other processing units or components known in the art. Additionally, each of the processors 304 may possess its own local memory, which also may store program modules, program data, and/or one or more operating systems.

Depending on the exact configuration and type of the hub device 102, the memory 306 may be volatile, such as RAM, non-volatile, such as ROM, flash memory, miniature hard drive, memory card, and the like, or some combination thereof. The memory 306 may include an operating system, one or more program modules, and may include program data.

The processors 304 may be coupled to the memory 306 and execute computer executable instructions stored in the memory 306. The processors 304 may also be couple modules and components of the hub device 102 and may perform various functions including instructing and causing the modules and components of the hub device 102 to perform their associated functions. The hub antenna 308 may be located inside, outside, or on the outside surface, of the housing 302. In this example, as shown in FIG. 3, the hub antenna 308 are shown to be located outside of the housing 302.

The fiber optic interface module 312 may be couple to the fiber optic broadband network 110 for accessing broadband services. The hub communication module 310 may be coupled to the processors 304, the fiber optic interface module 312, and the hub antenna 308, and may communicate with a plurality of premise devices for providing access to the broadband services via the hub antenna 308. In this example, two premise devices, 104 and 106, are shown to be in communication with the hub device 102. The hub antenna 308 may beam-form for achieving optimum link properties with the premise devices 104 and 106 in communication with the hub device 302. The hub communication module 310 may be configured to communicate with the premise devices 104 and 106 in a millimeter wave spectrum.

The hub device 102 may also comprise an input/output (I/O) interface 314 coupled to the processors 304. The I/O interface module 314 may be configured to communicate with a computing device, such as a computing device 316 loaded with appropriate applications for programming or checking the status of the hub device 102. The computing device 316 may have input device(s), such as a keyboard, a mouse, a pen, a voice input device, a touch input device, and the like, and output device(s), such as a display, speakers, a printer, and the like.

The I/O interface module 314 may comprise a connector, such as a telco connector, a USB connector, a RJ45 connector, and the like, and/or an RF communication module such as a near field communication (NFC), Bluetooth communication, or Wifi communication module for communication with the computer 316.

The hub device 102 may be configured to be mounted on a structure such as a side of a building, a powerline tower, a pad mount on the ground, a utility structure such as a telephone or utility pole, or any other suitable mount as described above with reference to FIG. 1.

The techniques and mechanisms of the hub device 102 and the premise device 104 described above with reference to FIGS. 1-3 are examples of such devices and are not intended to suggest any limitation as to the scope of use or functionality of any device utilized to perform the processes and/or procedures described above.

Some or all operations described above can be performed by execution of computer-readable instructions stored on a computer-readable storage medium, as defined below. The term "computer-readable instructions" as used in the description and claims, include routines, applications, application modules, program modules, programs, components, data structures, algorithms, and the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, and the like.

The computer-readable storage media may include volatile memory, such as random-access memory (RAM), and/or non-volatile memory, such as read-only memory (ROM), flash memory, etc. The computer-readable storage media may also include additional removable storage and/or non-removable storage including, but not limited to, flash memory, magnetic storage, optical storage, and/or tape storage that may provide non-volatile storage of computer-readable instructions, data structures, program modules, and the like.

A non-transient computer-readable storage medium is an example of computer-readable media. Computer-readable media includes at least two types of computer-readable media, namely computer-readable storage media and communications media. Computer-readable storage media includes volatile and non-volatile, removable and non-removable media implemented in any process or technology for storage of information such as computer-readable instructions, data structures, program modules, or other data. Computer-readable storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism. As defined herein, computer-readable storage media do not include communication media.

The computer-readable instructions stored on one or more non-transitory computer-readable storage media that, when executed by one or more processors, may perform operations described above with reference to FIGS. 1-3. Generally, computer-readable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

EXAMPLE CLAUSES

A. A broadband access premise device comprising: a housing; a first antenna and a second antenna disposed in the housing; a first communication module disposed in the housing and coupled to the first antenna, the first communication module configured to communicate with a broadband access hub device using a first telecommunication protocol via the first antenna for accessing broadband services available in a fiber optic broadband network through the broadband access hub device; a second communication module disposed in the housing and coupled to the second antenna and the first communication module, the second communication module configured to communicate with a plurality of user equipment (UEs) using a second telecommunication protocol via the second antenna for providing access to the broadband services to the UEs via the first communication module; and a power interface module disposed in the housing and coupled to the first and second communication modules, the power interface module configured to supply electrical power to the first and second communication modules from an electric utility meter.

B. The broadband access premise device as paragraph A recites, wherein the power interface module is further configured to: read electrical information associated with the electric utility meter stored in memory of the electrical utility meter, and provide the electrical information to the first communication module, and wherein the first communication module is further configured to transmit the electrical information to a service entity associated with the electric utility meter via the broadband services.

C. The broadband access premise device as paragraph B recites, wherein the housing access is configured to attach as a meter collar to the electrical utility meter.

D. The broadband access premise device as paragraph A recites, wherein the first communication module is further configured to communicate with the broadband access hub device using a first radio frequency (RF) spectrum, and wherein the second communication module is further configured to communicate with UEs using a second RF spectrum.

E. The broadband access premise device as paragraph D recites, wherein the second communication module is further configured to use channels in the second RF spectrum to communicate with the UEs that are different from channels in the second RF spectrum used by a neighboring broadband access premise device.

The broadband access premise device as paragraph A recites, wherein the first antenna is configured to beam-form for achieving optimum link properties with the broadband access hub device.

G. The broadband access premise device as paragraph A recites, wherein the second antenna is configured to beam-form for achieving optimum link properties with one or more UEs of the plurality of UEs in communication with the broadband access premise device.

H. The broadband access premise device as paragraph A recites, wherein the first communication module is further configured to communicate with the broadband access hub device in a millimeter wave spectrum.

I. The broadband access premise device as paragraph A recites, wherein the first communication module is further configured to communicate with another broadband access hub device.

J. A broadband access hub device comprising: a housing; a hub antenna disposed in the housing; a fiber optic interface module disposed in the housing, the fiber optic interface module configured to couple to a fiber optic broadband network for accessing broadband services available on the fiber optic broadband network; and a hub communication module disposed in the housing and coupled to the fiber optic interface module and the hub antenna, the hub communication module configured to communicate with a plurality of broadband access premise devices via the hub antenna for providing access to the broadband services, the hub antenna configured to beam-form for achieving optimum link properties with broadband access premise devices of the plurality of broadband access premise devices in communication with the broadband access hub device.

K. The broadband access hub device as paragraph J recites, wherein the hub communication module is further configured to communicate with the plurality of broadband access premise devices in a millimeter wave spectrum.

L. The broadband access hub device as paragraph J recites, wherein the broadband access hub device is configured to be mounted on a utility structure.

M. A broadband access system comprising: a broadband access hub device; and one or more broadband access premise devices, the broadband access hub device coupled to a fiber optic broadband network, the broadband access hub device configured to access broadband services available on the fiber optic broadband network and to provide access to the broadband services to the one or more broadband access premise devices by wirelessly communicating with the one or more broadband access premise devices using a first telecommunication protocol via a hub antenna, and a broadband access premise device having a first antenna, a second antenna, and a power interface module, the broadband access premise device configured to wirelessly communicate with the broadband access hub device via the first antenna using the first telecommunication protocol and to communicate with a plurality of user equipment (UEs) via the second antenna using a second telecommunication protocol for providing access to the broadband services through the broadband access hub device, the power interface module configured to supply electrical power to the broadband access premise device from an electric utility meter.

N. The broadband access system as paragraph M recites, wherein the broadband access premise device is further configured to use channels to communicate with the UEs that are different from channels used by a neighboring broadband access premise device.

O. The broadband access system as paragraph M recites, wherein the broadband access hub device and the broadband access premise device are further configured to communicate with each other in a millimeter wave spectrum through the hub antenna and the first antenna, respectively.

P. The broadband access system as paragraph M recites, wherein the hub antenna is configured to beam-form for achieving optimum link properties with one or more broadband access premise devices in communication with the broadband access hub device, and wherein the first antenna is configured to beam-form for achieving optimum link properties with the broadband access hub device.

Q. The broadband access system as paragraph M recites, wherein the second antenna is configured to beam-form for achieving optimum link properties with one or more UEs of the plurality of UEs in communication with the broadband access premise device.

R. The broadband access system as paragraph M recites, the broadband access premise device is configured to attach as a meter collar to the electrical utility meter.

S. The broadband access system as paragraph M recites, wherein the broadband access premise device is further configured to: read electrical information associated with the electric utility meter stored in memory of the electrical utility meter and transmit the electrical information to a service entity associated with the electric utility meter using the broadband services via the broadband access hub device.

T. The broadband access system as paragraph M recites, further comprising: another broadband access hub device coupled to the fiber optic broadband network, the other broadband access hub device configured to access broadband services available on the fiber optic broadband network and to provide access to the broadband services to at least one of the one or more broadband access premise devices by wirelessly communicating with the at least one of the one or more broadband access premise devices using the first telecommunication protocol via a hub antenna of the other broadband access hub device.

U. A broadband access premise device comprising: one or more processors; and memory coupled to the one or more processors, the memory storing computer executable instructions, that when executed by the one or more processors, cause the one or more processors to instruct modules to perform configured functions, the modules including: a first communication module coupled to a first antenna, the first communication module configured to communicate with a broadband access hub device using a first telecommunication protocol via the first antenna for accessing broadband services available on a fiber optic broadband network through the broadband access hub device; a second communication module coupled to a second antenna and the first communication module, the second communication module configured to communicate with a plurality of user equipment (UEs) using a second telecommunication protocol via the second antenna for providing access to the broadband services to the UEs via the first communication module; and a power interface module coupled to the first and second communication modules, the power interface module configured to supply electrical power to the first and second communication modules from an electric utility meter.

V. The broadband access premise device as paragraph U recites, wherein the power interface module is further configured to: read electrical information associated with the electric utility meter stored in memory of the electrical utility meter, and provide the electrical information to the first communication module, and wherein the first communication module is further configured to transmit the electrical information to a service entity associated with the electric utility meter via the broadband services.

W. The broadband access premise device as paragraph V recites, wherein the housing access is configured to attach as a meter collar to the electrical utility meter.

X. The broadband access premise device as paragraph U recites, wherein the first communication module is further configured to communicate with the broadband access hub device using a first radio frequency (RF) spectrum, and wherein the second communication module is further configured to communicate with UEs using a second RF spectrum.

Y. The broadband access premise device as paragraph X recites, wherein the second communication module is further configured to use channels in the second RF spectrum to communicate with the UEs that are different from channels in the second RF spectrum used by a neighboring broadband access premise device.

Z. The broadband access premise device as paragraph U recites, wherein the first antenna is configured to beam-form for achieving optimum link properties with the broadband access hub device.

AA. The broadband access premise device as paragraph U recites, wherein the second antenna is configured to beam-form for achieving optimum link properties with one or more UEs of the plurality of UEs in communication with the broadband access premise device.

AB. The broadband access premise device as paragraph U recites, wherein the first communication module is further configured to communicate with the broadband access hub device in a millimeter wave spectrum.

AC. The broadband access premise device as paragraph U recites, wherein the first communication module is further configured to communicate with another broadband access hub device.

AD. A broadband access hub device comprising: one or more processors; and memory coupled to the one or more processors, the memory storing computer executable instructions, that when executed by the one or more processors, cause the one or more processors to instruct modules to perform configured functions, the modules including: a fiber optic interface module configured to couple to a fiber optic broadband network for accessing broadband services; and a hub communication module coupled to the fiber optic interface module and a hub antenna, the hub communication module configured to communicate with a plurality of broadband access premise devices via the hub antenna for providing access to the broadband services, the hub antenna configured to beam-form for achieving optimum link properties with broadband access premise devices of the plurality of broadband access premise devices in communication with the broadband access hub device.

AE. The broadband access hub device as paragraph AD recites, wherein the hub communication module is further configured to communicate with the plurality of broadband access premise devices in a millimeter wave spectrum.

AF. The broadband access hub device as paragraph AD recites, wherein the broadband access hub device is configured to be mounted on a utility structure.

AG. A computer readable medium storing computer executable instructions, that when executed by one or more processors, cause the one or more processors to instruct modules to perform configured functions, the modules including: a first communication module coupled to a first antenna, the first communication module configured to communicate with a broadband access hub device using a first telecommunication protocol via the first antenna for accessing broadband services available on a fiber optic broadband network through the broadband access hub device; a second communication module coupled to a second antenna and the first communication module, the second communication module configured to communicate with a plurality of user equipment (UEs) using a second telecommunication protocol via the second antenna for providing access to the broadband services to the UEs via the first communication module; and a power interface module coupled to the first and second communication modules, the power interface module configured to supply electrical power to the first and second communication modules from an electric utility meter.

AH. The computer readable medium as paragraph AG recites, wherein the power interface module is further configured to: read electrical information associated with the electric utility meter stored in memory of the electrical utility meter, and provide the electrical information to the first communication module, and wherein the first communication module is further configured to transmit the electrical information to a service entity associated with the electric utility meter via the broadband services.

AI. The computer readable medium as paragraph AH recites, wherein the housing access is configured to attach as a meter collar to the electrical utility meter.

AJ. The computer readable medium as paragraph AG recites, wherein the first communication module is further configured to communicate with the broadband access hub device using a first radio frequency (RF) spectrum, and wherein the second communication module is further configured to communicate with UEs using a second RF spectrum.

AK. The computer readable medium as paragraph AK recites, wherein the second communication module is further configured to use channels in the second RF spectrum to communicate with the UEs that are different from channels in the second RF spectrum used by a neighboring broadband access premise device.

AL. The computer readable medium as paragraph AG recites, wherein the first antenna is configured to beam-form for achieving optimum link properties with the broadband access hub device.

AM. The computer readable medium as paragraph AG recites, wherein the second antenna is configured to beam-form for achieving optimum link properties with one or more UEs of the plurality of UEs in communication with the broadband access premise device.

AN. The computer readable medium as paragraph AG recites, wherein the first communication module is further configured to communicate with the broadband access hub device in a millimeter wave spectrum.

AO. The computer readable medium as paragraph AG recites, wherein the first communication module is further configured to communicate with another broadband access hub device.

AP. A computer readable medium storing computer executable instructions, that when executed by one or more processors, cause the one or more processors to instruct modules to perform configured functions, the modules including: a fiber optic interface module configured to couple to a fiber optic broadband network for accessing broadband services; and a hub communication module coupled to the fiber optic interface module and a hub antenna, the hub communication module configured to communicate with a plurality of broadband access premise devices via the hub antenna for providing access to the broadband services, the hub antenna configured to beam-form for achieving optimum link properties with broadband access premise devices of the plurality of broadband access premise devices in communication with the broadband access hub device.

AQ. The computer readable medium as paragraph AP recites, wherein the hub communication module is further configured to communicate with the plurality of broadband access premise devices in a millimeter wave spectrum.

AR. The computer readable medium as paragraph AP recites, wherein the broadband access hub device is configured to be mounted on a utility structure.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:
1. A first device comprising:
a housing configured to be at least partially received within a meter collar;
a first antenna;
a first communication module coupled to the first antenna; and
a second communication module coupled to the first communication module, wherein the first device is configured to:
wirelessly communicate, via the first communication module and the first antenna, with a second antenna of a second device, and
communicate, via the second communication module, with a third device for providing access to internet services available through the second device.

2. The first device of claim 1, wherein the first antenna is located external to the housing.

3. The first device of claim 1, wherein communicating, via the second communication module, with the third device comprises communicating over electrical wiring of a premise at which the meter collar is located.

4. The first device of claim 1, wherein communicating, via the second communication module, with the third device comprises wirelessly communicating with the third device.

5. The first device of claim 4, further comprising a third antenna coupled to the second communication module, and wherein wirelessly communicating with the third device comprises wirelessly communicating via the third antenna.

6. The first device of claim 1, further comprising a power over ethernet (POE) cable that couples the first antenna and the first communication module.

7. A broadband access premise device comprising:
a housing configured to couple to an electric utility meter;
an antenna;
a first communication module coupled to the antenna, the first communication module being configured to communicate with an internet network via the antenna for accessing internet services available on the internet network;
a second communication module coupled to the first communication module, the second communication module being configured to provide one or more devices with access to the internet services; and
a power interface module disposed in the housing and coupled to the first communication module and the second communication module, the power interface module configured to supply power to the first communication module and the second communication module from the electric utility meter.

8. The broadband access premise device of claim 7, wherein the second communication module is configured to provide the one or more devices with access to the internet services via at least one of:
utilizing electrical wiring of a premise at which the electric utility meter is located; or
wirelessly communicating with the one or more devices.

9. The broadband access premise device of claim 7, wherein the antenna is configured to beamform for achieving optimum link properties with the internet network.

10. The broadband access premise device of claim 7, further comprising a power over ethernet (POE) cable that couples the antenna and the first communication module, and wherein the antenna is configured to be disposed at various distances from the housing via the PoE cable.

11. The broadband access premise device of claim 7, further comprising a fiber optic interface, and wherein the broadband access premise device is further configured to access the internet services available on the internet network via the fiber optic interface.

12. The broadband access premise device of claim 7, wherein the second communication module is configured to communicate with a router for providing the one or more devices with access to the internet services.

13. The broadband access premise device of claim 7, wherein:
the first communication module is configured to communicate with the internet network using a first telecommunication protocol; and
the second communication module is configured to communicate with the one or more devices using a second telecommunication protocol to provide the one or more devices with access to the internet services.

14. The broadband access premise device of claim 7, further comprising a second antenna coupled to the second communication module.

15. A first device comprising:
a housing configured to couple to an electric utility meter;
a first antenna;
a first communication module communicatively coupled to the first antenna;
a second communication module communicatively coupled to the first communication module;
one or more processors; and
one or more computer readable media containing computer executable instructions that, when executed by the one or more processors, cause the first device to perform operations comprising:
communicate, via the first communication module and the first antenna, with a second antenna of a second device, and
communicate, via the second communication module and over at least one of a wired connection or a wireless connection, with an electronic device for providing access to internet services.

16. The first device of claim 15, further comprising a third antenna communicatively coupled to the second communication module, and wherein communicating with the electronic device comprises communicating, via the second communication module and the third antenna, with the electronic device for providing access to the internet services.

17. The first device of claim 15, wherein the second communication module couples to electrical wiring inside the electric utility meter for providing the electronic device with access to the internet services.

18. The first device of claim 15, further comprising a third communication module configured to communicatively couple with a second electronic device for accessing the internet services.

19. The first device of claim 15, wherein the first device communicates, via the second communication module, with a router for providing access to the internet services.

20. The first device of claim 15, further comprising a power over ethernet (POE) cable that communicatively couples the first antenna and the first communication module.

* * * * *